(12) United States Patent
Murayama et al.

(10) Patent No.: US 8,338,289 B2
(45) Date of Patent: Dec. 25, 2012

(54) METHOD OF MANUFACTURING A SEMICONDUCTOR CHIP INCLUDING A SEMICONDUCTOR SUBSTRATE AND A THROUGH VIA PROVIDED IN A THROUGH HOLE

(75) Inventors: Kei Murayama, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/901,028

(22) Filed: Oct. 8, 2010

(65) Prior Publication Data

US 2011/0027990 A1    Feb. 3, 2011

Related U.S. Application Data

(62) Division of application No. 11/427,562, filed on Jun. 29, 2006, now Pat. No. 7,843,068.

(30) Foreign Application Priority Data

Jun. 30, 2005    (JP) .................................. 2005-191407

(51) Int. Cl.
*H01L 21/4763*    (2006.01)
(52) U.S. Cl. ........ 438/637; 438/669; 438/459; 257/773; 257/E21.507
(58) Field of Classification Search .................. 257/773, 257/E21.507; 438/459, 637, 669
See application file for complete search history.

(56) References Cited

U.S. PATENT DOCUMENTS

| | | | |
|---|---|---|---|
| 6,239,495 B1 * | 5/2001 | Sakui et al. | 257/777 |
| 6,444,576 B1 | 9/2002 | Kong | |
| 6,495,912 B1 * | 12/2002 | Huang et al. | 257/700 |
| 6,624,506 B2 * | 9/2003 | Sasaki et al. | 257/686 |
| 6,882,045 B2 | 4/2005 | Massingill et al. | |
| 2002/0109236 A1 | 8/2002 | Kim et al. | |
| 2003/0222354 A1 * | 12/2003 | Mastromatteo et al. | 257/774 |
| 2004/0108587 A1 | 6/2004 | Chudzik et al. | |

FOREIGN PATENT DOCUMENTS

| | | |
|---|---|---|
| EP | 0907206 | 4/1999 |
| JP | 64-023564 | 1/1989 |
| JP | 05-029483 | 2/1993 |
| JP | 09-064050 | 3/1997 |
| JP | 2001-060654 | 3/2001 |
| JP | 2001-326326 | 11/2001 |
| JP | 2005-294582 | 10/2005 |
| JP | 2006-041450 | 2/2006 |
| WO | 2005/101475 | 10/2005 |
| WO | 2005/101476 | 10/2005 |
| WO | 2006/019156 | 2/2006 |

* cited by examiner

*Primary Examiner* — Robert Huber
(74) *Attorney, Agent, or Firm* — Rankin, Hill & Clark LLP

(57) ABSTRACT

A semiconductor chip includes a semiconductor substrate, a through via provided in a through hole that passes through the semiconductor substrate, insulating layers laminated on the semiconductor substrate, a multi-layered wiring structure having a first wiring pattern and a second wiring pattern, and an external connection terminal provided on an uppermost layer of the multi-layered wiring structure, wherein the through via and the external connection terminal are connected electrically by the second wiring pattern.

17 Claims, 15 Drawing Sheets

US 8,338,289 B2

METHOD OF MANUFACTURING A SEMICONDUCTOR CHIP INCLUDING A SEMICONDUCTOR SUBSTRATE AND A THROUGH VIA PROVIDED IN A THROUGH HOLE

TECHNICAL FIELD

The present disclosure relates to a semiconductor chip and a method of manufacturing the same. More particularly, the present disclosure relates to a semiconductor chip, which is stacked together with other semiconductor chips and electrically connected with other semiconductor chips, and a method of manufacturing the same.

RELATED ART

In the related art, in order to achieve an improvement in the packaging density, it is contemplated that a plurality of semiconductor chips are stacked and electrically connected mutually. Through vias that are passed through the semiconductor chips and connected electrically to external connection terminals provided on the semiconductor chips are formed in these plural semiconductor chips (see FIG. 22).

FIG. 22 is a sectional view of a semiconductor chip having the through vias in the related art.

Referring to FIG. 22, a semiconductor chip 100 has a semiconductor substrate 101, insulating films 102, 105, 108, a multi-layered wiring structure 103, external connection terminals 104 through holes 107, and through vias 109.

The insulating film 102 is provided on the thinned semiconductor substrate 101. The insulating film 102 insulates wirings 112 provided in the multi-layered wiring structure 103 from the semiconductor substrate 101. The multi-layered wiring structure 103 is constructed by a plurality of laminated insulating layers 111, the wirings 112, and vias 113.

The external connection terminals 104 are provided to an uppermost layer of the multi-layered wiring structure 103. The insulating film 105 is provided to expose the external connection terminals 104 and cover the upper surface of the multi-layered wiring structure 103.

The through holes 107 are formed to pass through the semiconductor substrate 101 and the multi-layered wiring structure 103 and expose the external connection terminals 104. The insulating film 108 is provided to cover a side surface of the through hole 107. The insulating film 108 insulates the through via 109 from the semiconductor substrate 101. The through vias 109 are provided in the through holes 107 on which the insulating film 108 is formed respectively. The through vias 109 connect electrically a back surface 101B of the semiconductor substrate 101 and the external connection terminals 104.

FIG. 23 to FIG. 27 are views showing steps of manufacturing a semiconductor chip in the related art. In FIG. 23 to FIG. 27, the same reference symbols are affixed to the same constituent portions as the semiconductor chip 100 explained in FIG. 22.

Next, a method of manufacturing the semiconductor chip 100 will be explained with reference to FIG. 23 to FIG. 27 hereunder. First, in steps in FIG. 23, the insulating films 102, 105, the multi-layered wiring structure 103, and the external connection terminals 104 are formed on the semiconductor substrate 101, and then the semiconductor substrate 101 is thinned from the back surface 101B side.

Then, in steps in FIG. 24, the through holes 107 for exposing the external connection terminals 104 are formed from the back surface 101B side of the semiconductor substrate 101 by the dry etching method. Then, in step in FIG. 25, the insulating film 108 is formed on the through holes 107 respectively. Then, in step in FIG. 26, the unnecessary insulating film 108 provided on the external connection terminals 104 is removed respectively. Then, in step in FIG. 27, the through vias 109 are formed in the through holes 107 on which the insulating film 108 is formed respectively. Accordingly, the semiconductor chip 100 is manufactured (see Japanese Patent Unexamined Publication No. 2001-60654, for example).

However, in the semiconductor chip 100 in the related art, a plurality of different materials (e.g., the insulating film 102, the insulating layers 111, the wirings 112, and the like) must be etched upon forming the through holes 107. Therefore, it was difficult to form the through holes 107.

Also, in case the through holes 107 are formed by applying the etching to the semiconductor substrate 101, the insulating layers 111, and the wirings 112 individually, the manufacturing steps become complicated. Thus, such a problem existed that a production cost of the semiconductor chip 100 is increased.

SUMMARY

Embodiments of the present invention provide a semiconductor chip capable of reducing a production cost by forming easily through holes used to provide through vias that are connected electrically to external connection terminals, and a method of manufacturing the same.

According to an aspect of one or more embodiments of the invention, a semiconductor chip includes a semiconductor substrate; a multi-layered wiring structure having a plurality of insulating layers laminated on the semiconductor substrate, and a first wiring pattern provided in the plurality of insulating layers; and an external connection terminal provided on an uppermost layer of the multi-layered wiring structure; wherein a through via is provided in the through hole that passes through the semiconductor substrate, and a second wiring pattern for connecting electrically the through via and the external connection terminal is provided in the plurality of insulating layers.

According to the present disclosure, since the second wiring pattern for connecting electrically the through via and the external connection terminal is provided in a plurality of insulating layers, the through hole in which the through via is provided may be formed to pass through only the semiconductor substrate. Therefore, a production cost of the semiconductor chip can be reduced by forming easily the through hole rather than the related art.

Further, according to another aspect of one or more embodiments of the invention, a method of manufacturing a semiconductor chip, that includes a semiconductor substrate that includes a semiconductor substrate, a multi-layered wiring structure having a plurality of insulating layers laminated on the semiconductor substrate and a first wiring pattern provided in the plurality of insulating layers, an external connection terminal provided on an uppermost layer of the multi-layered wiring structure, a through via provided in a through hole that passes through the semiconductor substrate, and a second wiring pattern provided in the plurality of insulating layers to connect electrically the through via and the external connection terminal, includes steps of: forming simultaneously the first wiring pattern and the second wiring pattern on the semiconductor substrate; forming the through hole, which exposes the second wiring pattern, in the semiconductor substrate; forming an insulating film on a side surface of the through hole; and forming the through via in a through hole on which the insulating film is formed.

According to the present disclosure, the through hole can be formed as the through hole that passes through merely the semi conductor substrate. Therefore, the through hole can be formed easily by one etching step, and thus a production cost of the semi conductor chip can be reduced. Also, since the second wiring pattern that connects electrically the external connection terminal and the through via can be formed simultaneously with the first wiring pattern, an increase of a production cost can be suppressed.

Various implementations may include one or more the following advantages. For example, a production cost can be reduced by forming easily through holes used to provide through vias that are connected electrically to external connection terminals.

Other features and advantages may be apparent from the following detailed description, the accompanying drawings and the claims.

DETAILED DESCRIPTION

Next, embodiments of the present invention will be explained with reference to the drawings hereinafter.

Figure 1:
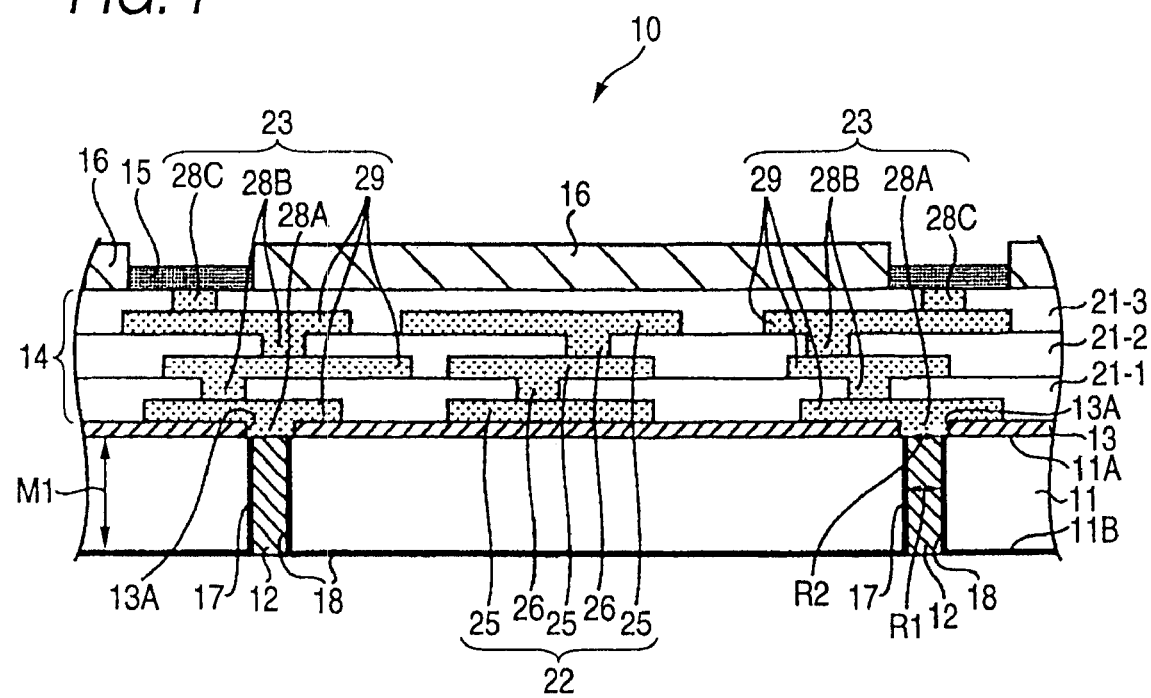
FIG. 1 is a sectional view of a semiconductor chip according to an embodiment of the present invention.

FIG. 1 is a sectional view of a semiconductor chip according to an embodiment of the present invention.

Referring to FIG. 1, a semiconductor chip 10 includes a plurality of semiconductor elements (not shown) each of which consists of a semiconductor substrate 11, through vias 12, insulating films 13, 18, a multi-layered wiring structure 14, external connection terminals 15, a protection film 16, transistors, and the like.

The semiconductor substrate 11 is thinned, and through holes 17 used to provide the through vias 12 are formed in the semiconductor substrate 11. As the semiconductor substrate 11, a silicon substrate can be employed by way of example. Also, as the semiconductor substrate 11, a compound semiconductor such as GaAs, or the like may be employed other than the silicon substrate. A thickness M1 of the semiconductor substrate 11 can be set to 200 μm, for example.

The through via 12 is provided in the through hole 17 via the insulating film 18 made of $SiO_2$, as an example. The through via 12 is passed through the semiconductor substrate 11, and one end of the through via 12 is exposed from a back surface 11B of the semiconductor substrate 11 and the other end is connected electrically to a second wiring pattern 23 described later. As the material of the through via 12, for example, Cu may be employed. Also, a diameter R1 of the through via 12 can be set to 50 μm, for example.

The insulating film 13 is made of $SiO_2$, for example, and is provided to cover a surface 11A of the semiconductor substrate 11. Opening portions 13A for exposing the through vias 12 are formed in portions of the insulating film 13 opposing to the through vias 12. A diameter R2 of the opening portion 13A can be set to 70 μm, for example.

The multi-layered wiring structure 14 is provided on the surface 11A of the semiconductor substrate 11, and has a plurality of (in the present embodiment, three) laminated insulating layers 21-1 to 21-3 and a first wiring pattern 22 and the second wiring pattern 23.

The insulating layers 21-1 to 21-3 are laminated on the surface 11A of the semiconductor substrate 11 in order of the insulating layer 21-1, the insulating layer 21-2, and the insulating layer 21-3. As the insulating layers 21-1 to 21-3, for example, an inorganic insulating film can be employed, and more particularly an $SiO_2$ film can be employed.

The first wiring patterns 22 are provided to the insulating layers 21-1 to 21-3, and are stacked alternately in a state that a plurality of wirings 25 and vias 26 are connected electrically. The first wiring pattern 22 is provided in the semiconductor chip 10 in the related art and is the wiring pattern used to improve the integration density of the semiconductor chip 10. Also, the first wiring pattern 22 connect electrically a plurality of semiconductor elements (not shown) formed of a transistor, or the like to constitute a semiconductor circuit.

The second wiring pattern 23 is provided in the insulating film 13 and the insulating layers 21-1 to 21-3 to connect electrically the through via 12 and the external connection terminal 15 formed on the insulating layer 21-3. The second wiring pattern 23 is constructed by stacking sequentially a via 28A, a wiring 29, a via 28B, the wiring 29, the via 28B, the wiring 29, a via 28C such that the via 28A and the via 28C are connected electrically. Also, although not shown, the second wiring pattern may be connected electrically to the first wiring pattern.

The via 28A is provided in the opening portion 13A formed in the insulating film 13. The via 28C is connected electrically to the external connection terminal 15. As the material of the vias 28A to 28C and the wiring 29, for example, Cu, Al, or the like can be employed.

In this manner, since the second wiring patterns 23 for connecting electrically the via 12 and the external connection terminal 15 respectively are provided, the through holes 17 in which the through vias 12 are provided may be formed to pass through only the semiconductor substrate 11. Therefore, a production cost of the semiconductor chip 10 can be reduced by forming easily the through holes 17 rather than the related art.

The external connection terminals 15 are provided on portions of the insulating layer 21-3 corresponding to forming positions of the vias 28C. The external connection terminals 15 are connected electrically to the vias 28C. As the material of the external connection terminal 15, for example, Cu, Al, or the like can be employed. Also, a thickness of the external connection terminal 15 can be set to 0.5 µm, for example.

The protection film 16 is provided to cover the insulating layer 21-3 in a state that the external connection terminals 15 are exposed. As the protection film 16, for example, an $SiO_2$ film, an SiN film, a polyimide resin, or the like can be employed.

According to the semiconductor chip of the present embodiment, since the second wiring patterns 23 for connecting electrically the via 12 and the external connection terminal 15 respectively are provided, the through holes 17 in which the through vias 12 are provided may be formed to pass through only the semiconductor substrate 11. Therefore, a production cost of the semiconductor chip 10 can be reduced by forming easily the through holes 17 in contrast to the related art.

FIG. 2 to FIG. 16 are views showing steps of manufacturing the semiconductor chip according to the present embodiment. In FIG. 2 to FIG. 16, the same reference symbols are affixed to the same constituent portions as those in the semiconductor chip 10 explained in FIG. 1.

Figure 2:
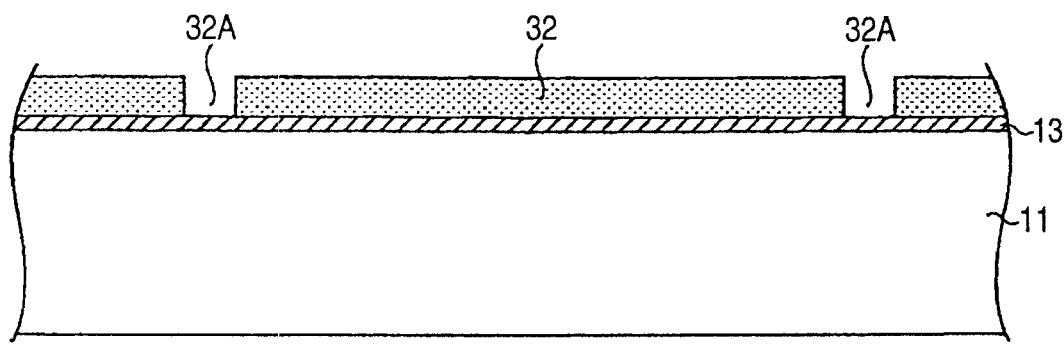
FIG. 2 is a view (#1) showing steps of manufacturing a semiconductor chip according to the present embodiment.

First, in steps in FIG. 2, the insulating film 13 and a resist film 32 having opening portions 32A each corresponding to a shape of the via 28A are formed sequentially on the semiconductor substrate 11 before a thickness of such substrate is reduced. As the semiconductor substrate 11, for example, a silicon wafer can be employed. As the insulating film 13, for example, an $SiO_2$ film can be employed.

Figure 3:
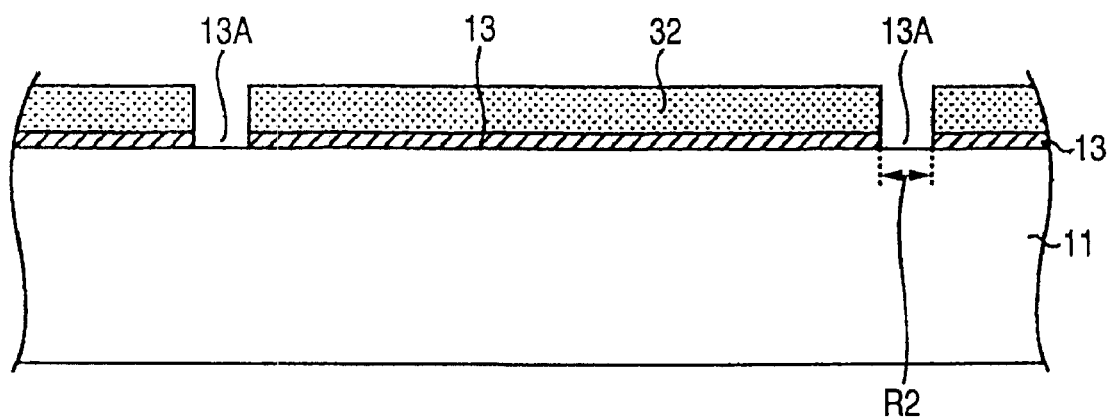
FIG. 3 is a view (#2) showing steps of manufacturing the semiconductor chip according to the present embodiment.

Then, in step in FIG. 3, the opening portions 13A for exposing the semiconductor substrate 11 are formed in the insulating film 13 by etching the insulating film 13 using the resist film 32 as a mask. A diameter R2 of the opening portion 13A can be set to 70 µm, for example. Also, the resist film 32 is removed by a resist remover after the opening portions 13A are formed.

Figure 4:
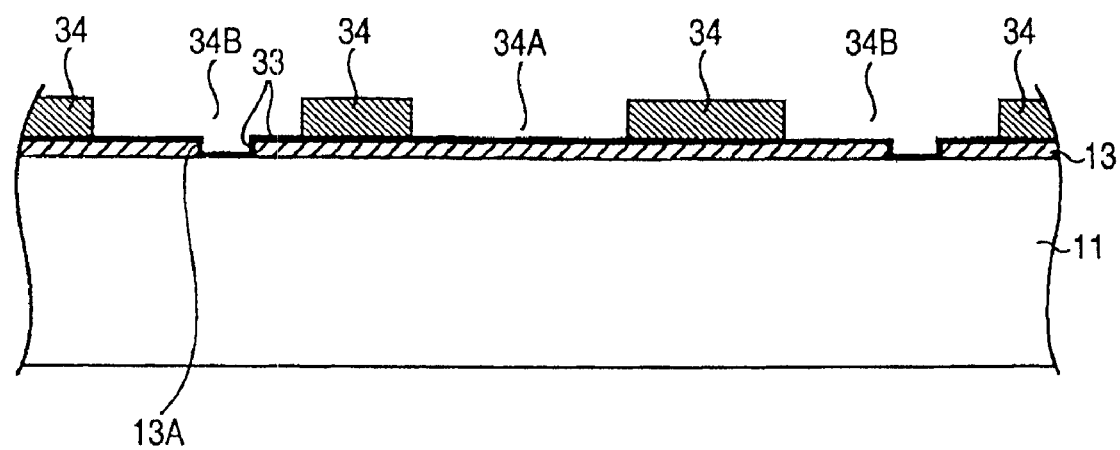
FIG. 4 is a view (#3) showing steps of manufacturing the semiconductor chip according to the present embodiment.

Then, in steps in FIG. 4, a seed layer 33 is formed on portions of the semiconductor substrate 11 corresponding to the opening portions 13A and the insulating film 13. As the seed layer 33, a Ti/Cu laminated film in which a Ti layer and a Cu layer are laminated sequentially by a sputter method, an evaporation method, an electroless plating method, or the like, for example, can be employed.

Then, a resist film 34 having opening portions 34A and opening portions 34B is formed on the seed layer 33. This opening portion 34A exposes a forming area of the first wiring pattern 22 (in this case, forming area of the wiring 25), and this opening portion 34B exposes a forming area of the second wiring pattern 23 (in this case, forming areas of the via 28A and the wiring 29).

Figure 5:
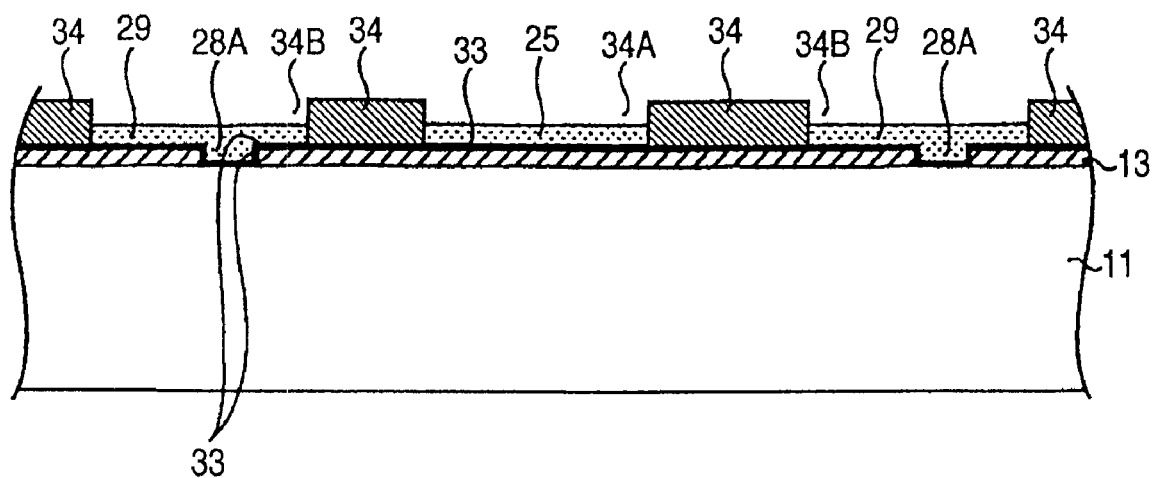
FIG. 5 is a view (#4) showing steps of manufacturing the semiconductor chip according to the present embodiment.

Then, in steps in FIG. 5, a plating film is deposited on the seed layer 33 by the electroplating method. Thus, the wiring 25 (the first wiring pattern 22) is formed on portions of the seed layer 33 corresponding to the opening portions 34A and simultaneously the via 28A and the wiring 29 (the second wiring pattern 23) are formed on portions of the seed layer 33 corresponding to the opening portion 34B. As the wirings 25, 29 and the via 28A, for example, a Cu plating film can be employed.

Figure 6:
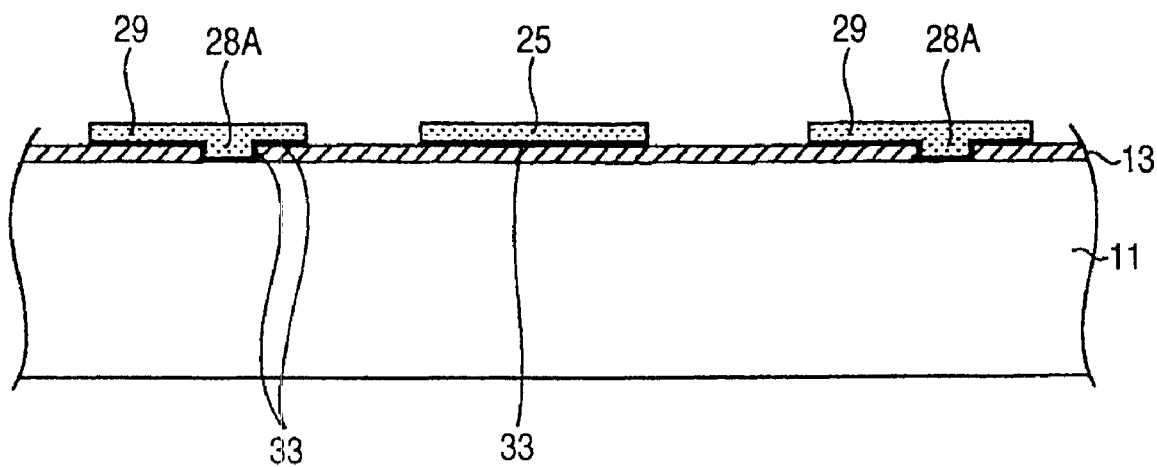
FIG. 6 is a view (#5) showing steps of manufacturing the semiconductor chip according to the present embodiment.
Figure 7:
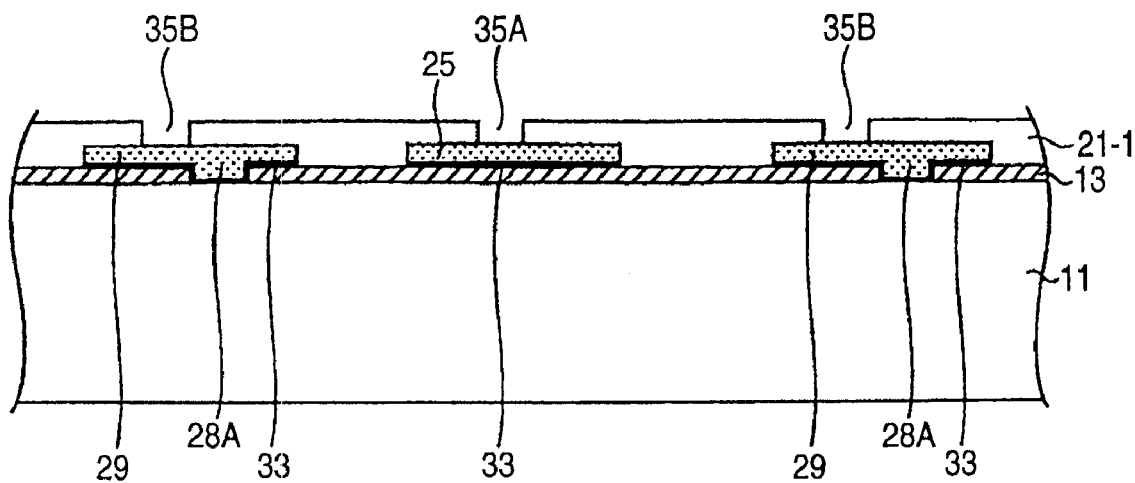
FIG. 7 is a view (#6) showing steps of manufacturing the semiconductor chip according to the present embodiment.

Then, in steps in FIG. 6, the resist film 34 is removed by the resist remover, and then the seed layer 33 is removed. In steps in FIG. 7, the insulating layer 21-1 for covering a resultant structure shown in FIG. 6 and having opening portions 35A, from which the wiring 25 is exposed respectively, and opening portions 35B, from which the wiring 29 is exposed respectively, is formed.

Figure 8:
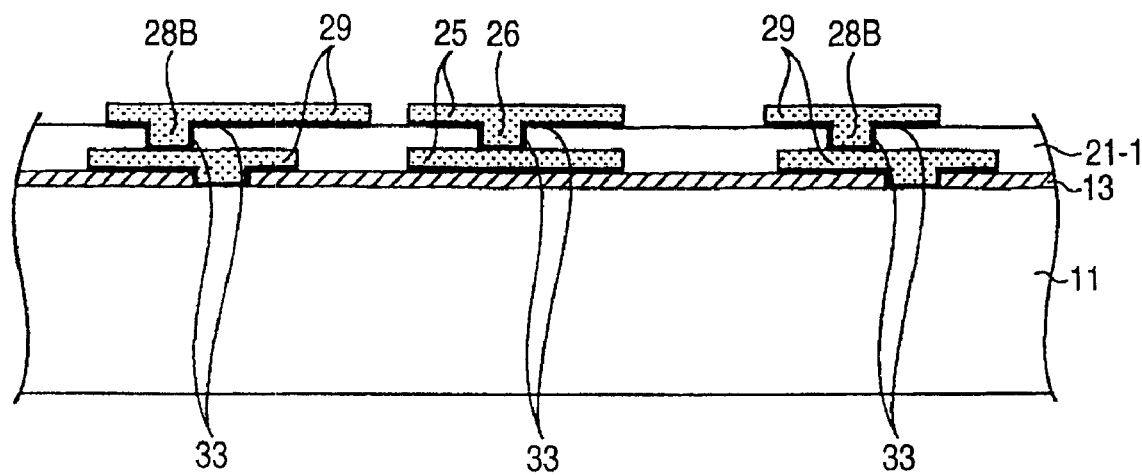
FIG. 8 is a view (#7) showing steps of manufacturing the semiconductor chip according to the present embodiment.
Figure 9:
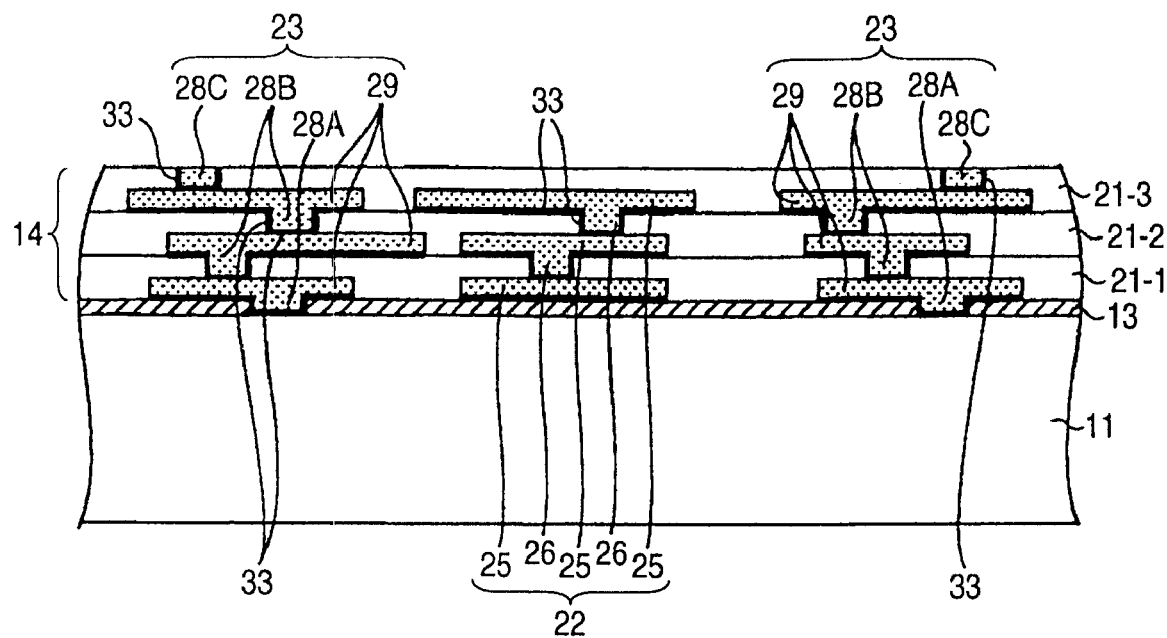
FIG. 9 is a view (#8) showing steps of manufacturing the semiconductor chip according to the present embodiment.

Then, as shown in FIG. 8, the vias 28B, 26 and the wirings 25, 29 (the first and second wiring patterns 22, 23) are formed simultaneously on the insulating layer 21-1 by the same approach as steps in FIG. 4 to FIG. 6 explained as above. Then, the insulating layer 21-2 is formed by the same approach as step in FIG. 7. Then, as shown in FIG. 9, the multi-layered wiring structure 14 having the laminated insulating layers 21-1 to 21-3, the first wiring pattern 22, and the second wiring pattern 23 is formed by repeating steps in FIG. 4 to FIG. 7. As the vias 28B, 26, for example, a Cu plating film can be employed. Also, as the insulating layers 21-1 to 21-3, for example, the $SiO_2$ film formed by the CVD method can be employed.

In this manner, since the first wiring pattern 22 and the second wiring pattern 23 can be formed at the same time, there is no need to provide separately the step of forming the second wiring pattern 23. Therefore, an increase in a production cost can be suppressed.

Figure 10:
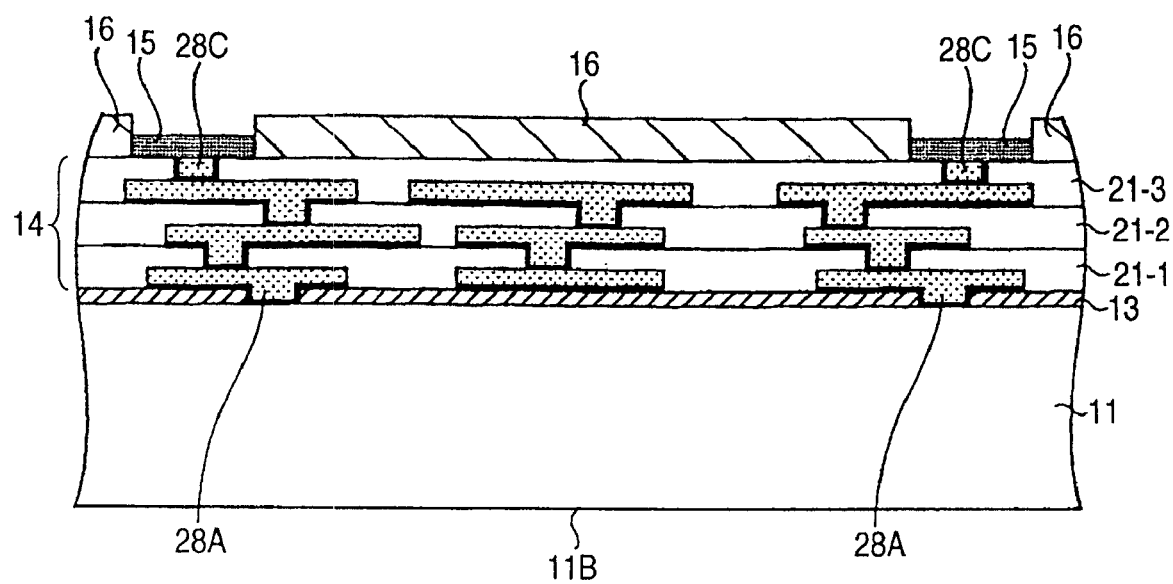
FIG. 10 is a view (#9) showing steps of manufacturing the semiconductor chip according to the present embodiment.

Then, in steps in FIG. 10, the external connection terminals 15 are formed on portions of the insulating layer 21-3 corresponding to forming positions of the vias 28C, and then the protection film 16 for exposing the external connection terminal 15 and covering an upper surface of the insulating layer 21-3 is formed. Concretely, for example, an Al film (thickness 0.5 µm) acting as the external connection terminal 15 is formed by the sputter method, and then a polyimide resin film acting as the protection film 16 is formed by the spin coating method, the spray method, the dipping method, or the like.

Figure 11:
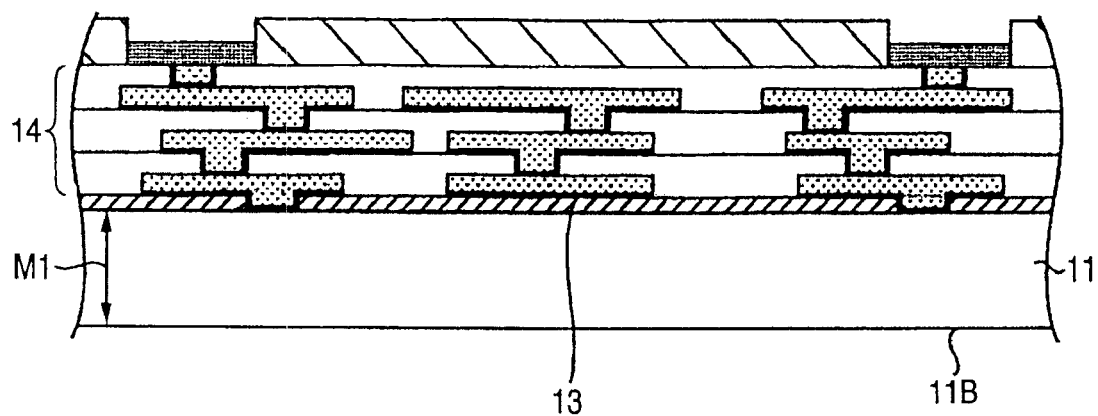
FIG. 11 is a view (#10) showing steps of manufacturing the semiconductor chip according to the present embodiment.

Then, in steps in FIG. 11, the semiconductor substrate 11 is thinned from the back surface 11B side of the semiconductor substrate 11 (semiconductor substrate thinning step). In the step of thinning the semiconductor substrate 11, for example, a backside grinder can be employed. A thickness M1 of the thinned semiconductor substrate 11 can be set to 200 µm, for example.

In this manner, an aspect ratio (thickness M1 of the semiconductor substrate 11/diameter of the through hole 17) of the through hole 17 can be reduced by reducing a thickness of the semiconductor substrate 11, and thus the through holes 17 can be formed with good precision. In this case, the semiconductor substrate 11 may be thinned by using the grinding method except the grinder.

Figure 12:
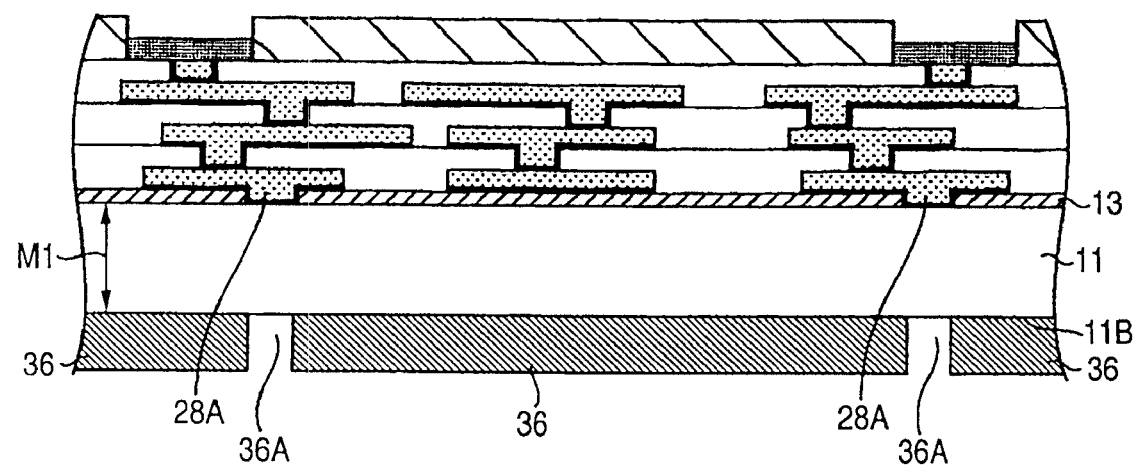
FIG. 12 is a view (#11) showing steps of manufacturing the semiconductor chip according to the present embodiment.

Then, in step in FIG. 12, a resist layer 36 having opening portions 36A, which expose portions of the semiconductor substrate 11 corresponding to the forming portions of the through vias 12, is formed on the back surface 11B of the thinned semiconductor substrate 11.

Figure 13:
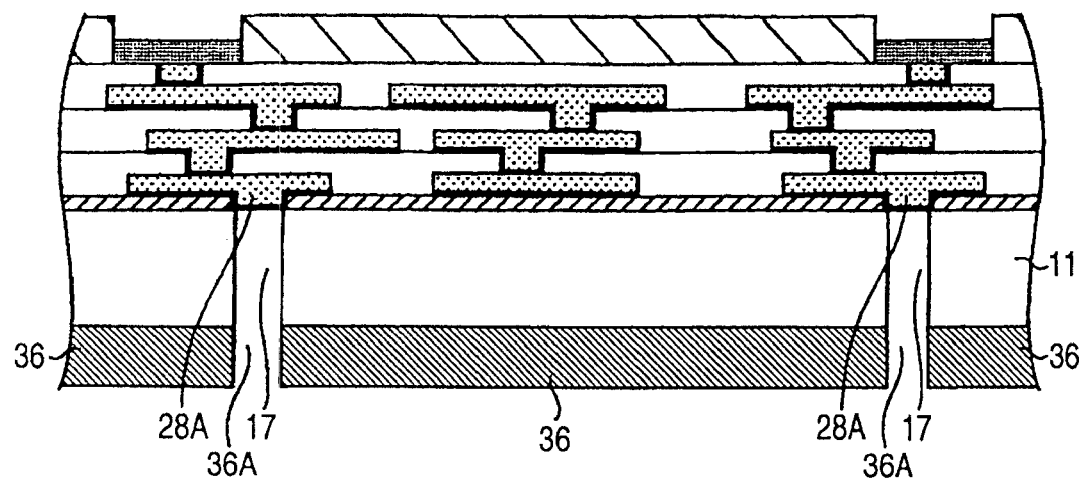
FIG. 13 is a view (#12) showing steps of manufacturing the semiconductor chip according to the present embodiment.

Then, in step in FIG. 13, the through holes 17, which pass through the semiconductor substrate 11 and expose the via 28A of the second wiring pattern 23, are formed by the dry etching method using the resist layer 36 as a mask (through hole forming step). The resist layer 36 is removed by the resist remover after the through holes 17 are formed.

In this manner, the through holes 17 that pass through only the semiconductor substrate 11 can be formed easily by the etching at a time. Therefore, a production cost of the semiconductor chip 10 can be reduced.

Figure 14:
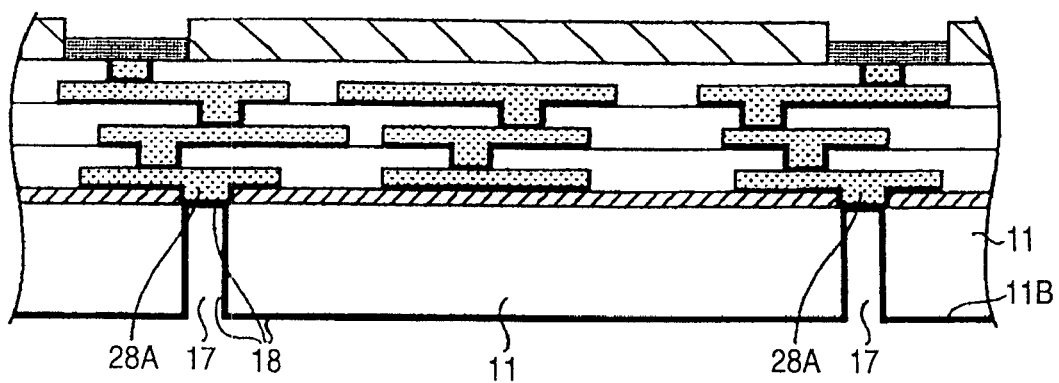
FIG. 14 is a view (#13) showing steps of manufacturing the semiconductor chip according to the present embodiment.
Figure 15:
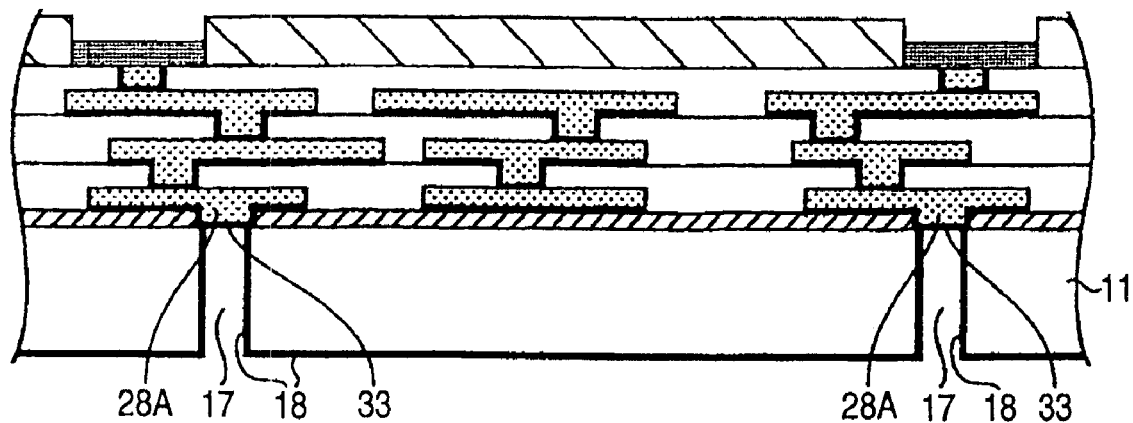
FIG. 15 is a view (#14) showing steps of manufacturing the semiconductor chip according to the present embodiment.

Then, in step in FIG. 14, the insulating film 18 is formed on the through holes 17 and the back surface 11B respectively (insulating film forming step). More particularly, for example, the $SiO_2$ film is formed by the CVD method. Then, in step in FIG. 15, the insulating film 18 provided on the via 28A is removed. For example, the dry etching method, the wet etching method, or the like can be employed to remove the insulating film 18. As an etching solution of the wet etching method, for example, a KOH solution can be employed.

Figure 16:
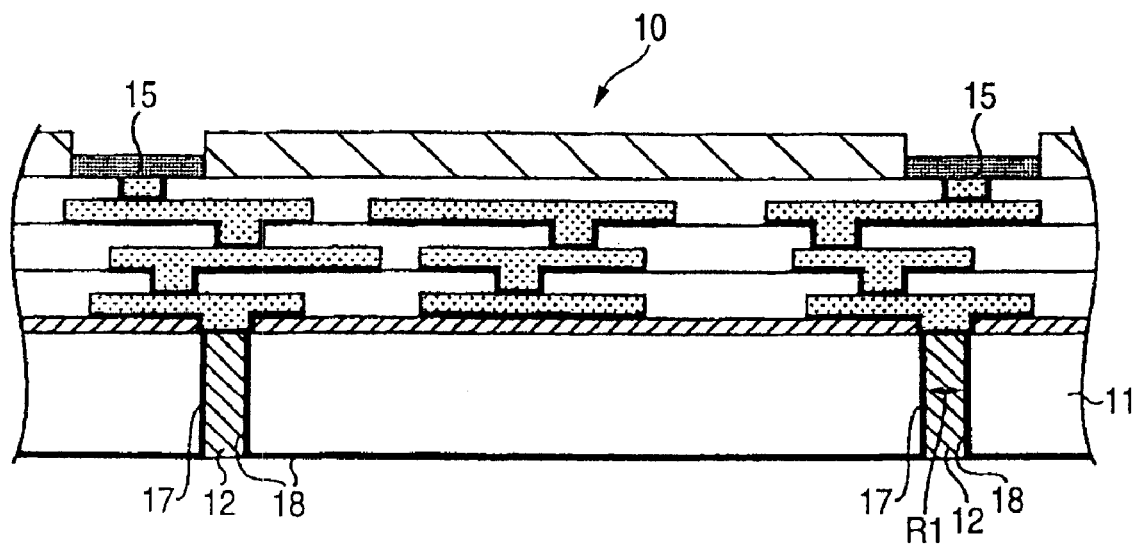
FIG. 16 is a view (#15) showing steps of manufacturing the semiconductor chip according to the present embodiment.

Then, in step in FIG. 16, the through vias 12 are formed by filling the conductive material into the through holes 17 on which the insulating film 18 is provided respectively (through via forming step). More particularly, the Ti/Cu laminated film acting as the seed layer (not shown) is formed by the sputter method to cover a lower surface of a resultant structure shown in FIG. 15 and the through holes 17 on which the insulating film 18 is provided respectively, then the resist film having the opening portions from which the through holes 17 are exposed is formed on the lower surface of the resultant structure shown in FIG. 15, then the conductive material is filled into the through holes 17 by the electroplating method using the seed layer as a power feeding layer, and then the resist film and the unnecessary Ti/Cu laminated film are removed sequentially.

At this time, pads may be formed on edge portions of the through holes 17 by forming the opening portions in the resist film to expose the insulating film 18 around the through holes 17. Also, wirings connected electrically to the through vias 12 may be formed on the lower surface of the resultant structure shown in FIG. 15 by forming opening portions corresponding to wiring shapes in the resist film.

Here, the seed layer may be formed by the evaporation method or the electroless plating method other than the sputter method. Also, as the conductive material, for example, Cu can be employed. A diameter R1 of the through via 12 can be set to 50 μm, for example.

According to the method of manufacturing the semiconductor chip of the present embodiment, the through holes 17 that passes through merely the semiconductor substrate 11 can be formed easily by one etching step, and thus a production cost of the semiconductor chip 10 can be reduced. Also, the second wiring patterns 23 that connect electrically the external connection terminal 15 and the through via 12 respectively can be formed simultaneously with the first wiring patterns 22, and thus an increase of a production cost can be suppressed.

Figure 17:
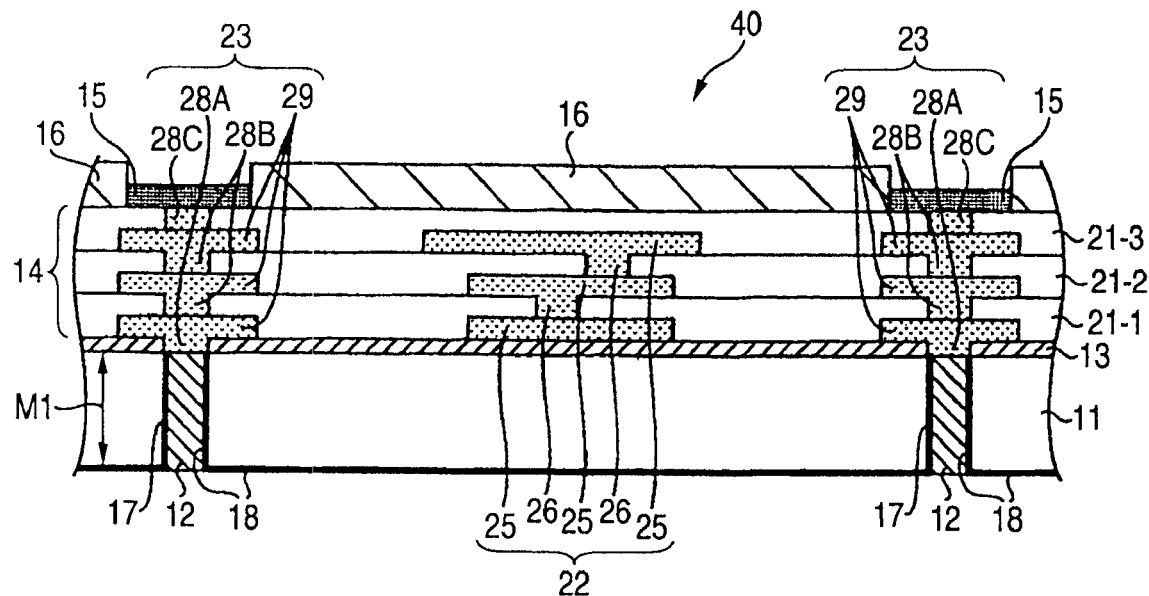
FIG. 17 is a sectional view of a semiconductor chip according to a first variation of the present embodiment.

FIG. 17 is a sectional view of a semiconductor chip according to a first variation of the present embodiment. In FIG. 17, the same reference symbols are affixed to the same constituent portions as the semiconductor chip 10 of the present embodiment, and their explanation will be omitted herein.

Referring to FIG. 17, a semiconductor chip 40 is constructed in the same manner as the semiconductor chip 10 except that the through vias 12 are provided in portions of the semiconductor substrate 11 positioned almost directly under the external connection terminals 15 and also a plurality of vias 28A to 28C are arranged in a plurality of insulating layers 21-1 to 21-3, which are positioned between the through via 12 and the external connection terminals 15, to intersect almost orthogonally with the surface of the semiconductor substrate 11.

In this manner, a plurality of vias 28A to 28C are arranged in a plurality of insulating layers 21-1 to 21-3, which are positioned between the through via 12 and the external connection terminals 15, to intersect almost orthogonally with the surface of the semiconductor substrate 11. Therefore, a wiring length of the second wiring pattern 23 that connects the external connection terminals 15 and the through via 12 can be shortened, so that the semiconductor chip 40 can be operated at a high speed. In this case, the semiconductor chip 40 can be manufactured by the same approach as the semiconductor chip 10 explained above.

Figure 18:
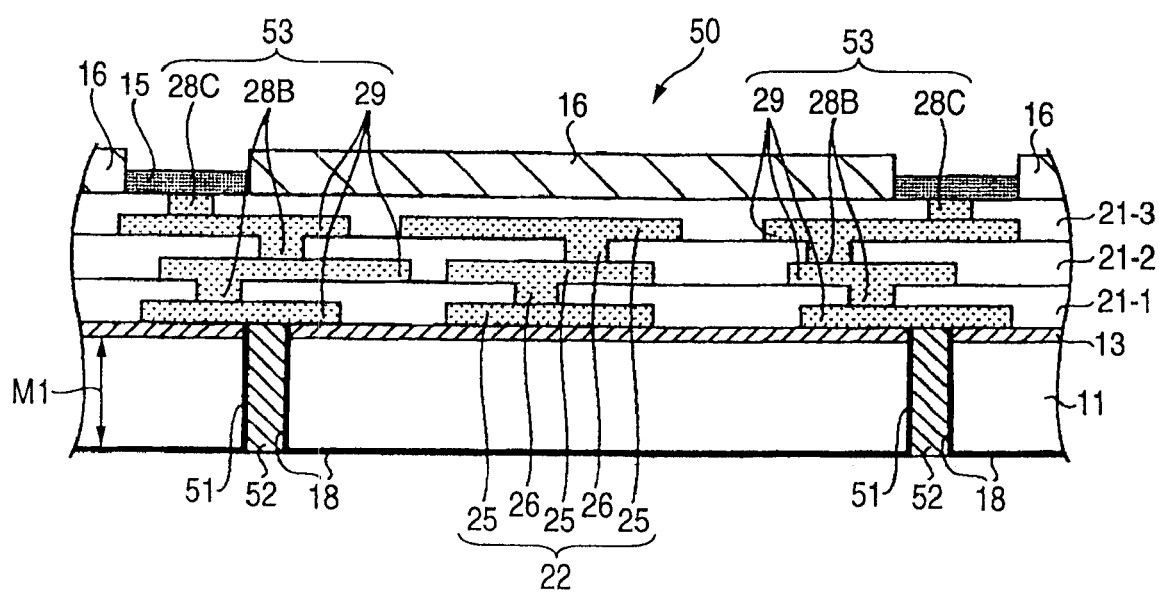
FIG. 18 is a sectional view of a semiconductor chip according to a second variation of the present embodiment.

FIG. 18 is a sectional view of a semiconductor chip according to a second variation of the present embodiment. In FIG. 18, the same reference symbols are affixed to the same constituent portions as the semiconductor chip 10 of the present embodiment, and their explanation will be omitted herein.

Referring to FIG. 18, a semiconductor chip 50 is constructed in the same manner as the semiconductor chip 10 except that through vias 52 and second wiring patterns 53 are provided instead of the through vias 12 and the second wiring patterns 23.

The through vias 52 are provided in through holes 51 that pass through the thinned semiconductor substrate 11 and the insulating film 13. The through hole 51 exposes the wiring 29 provided on the insulating film 13. As the material of the through via 52, the same material as the through via 12 can be employed.

The second wiring patterns 53 are constructed in the same manner as the second wiring patterns 23 except that the via 28A is removed from the structure of the second wiring pattern 23. The wiring 29 provided on the insulating film 13 is connected electrically to the through via 52.

In the semiconductor chip 50 constructed in this manner, the same advantages as the semiconductor chip 10 of the present embodiment can be achieved.

Figure 19:
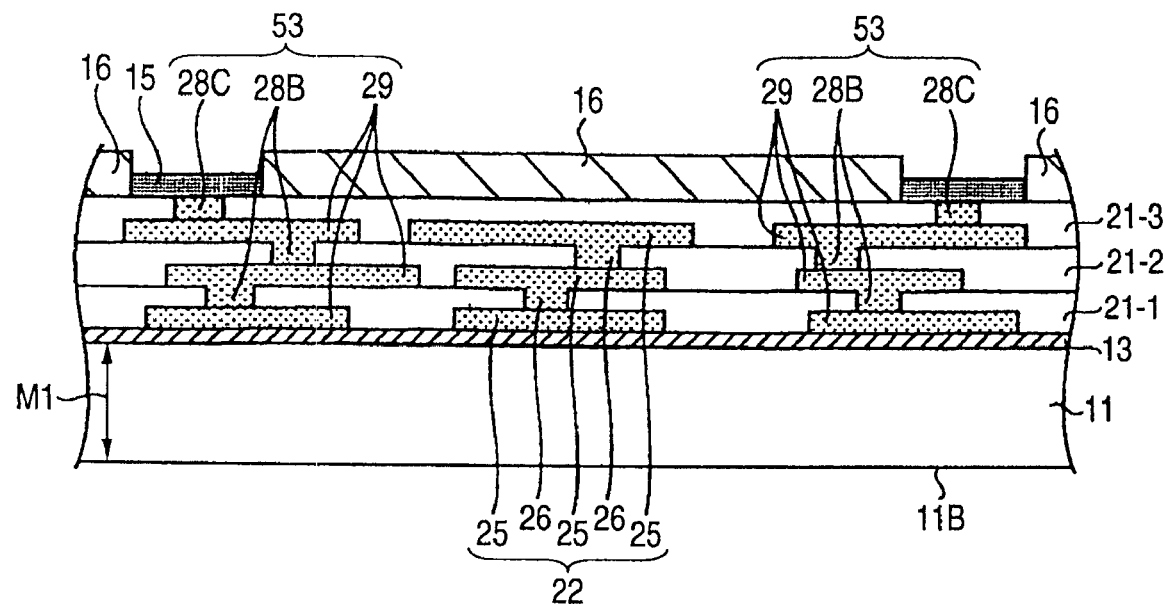
FIG. 19 is a view (#1) showing steps of manufacturing a semiconductor chip according to the second variation of the present embodiment.
Figure 20:
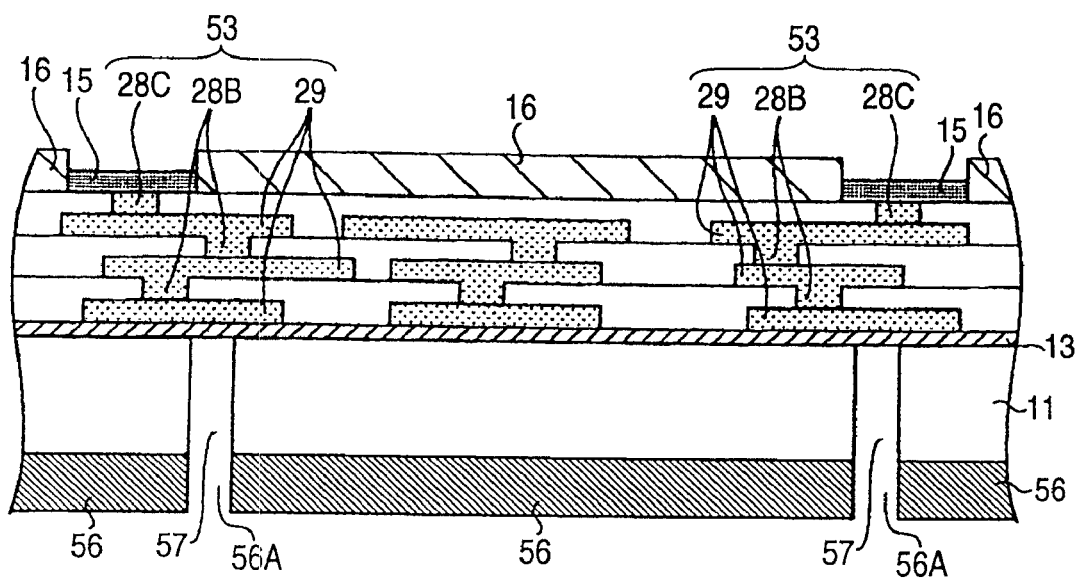
FIG. 20 is a view (#2) showing steps of manufacturing a semiconductor chip according to the second variation of the present embodiment.
Figure 21:
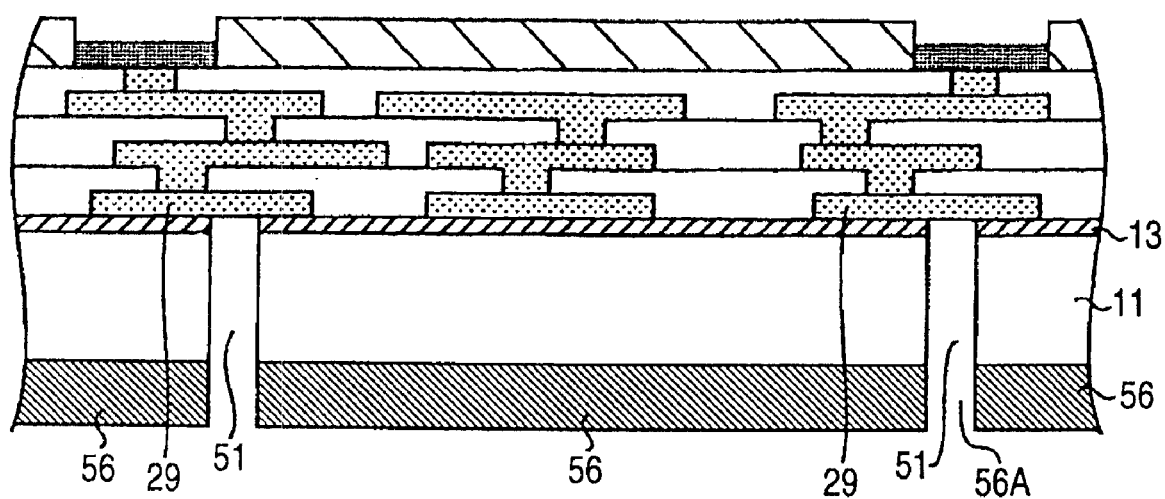
FIG. 21 is a view (#3) showing steps of manufacturing a semiconductor chip according to the second variation of the present embodiment.
Figure 22:
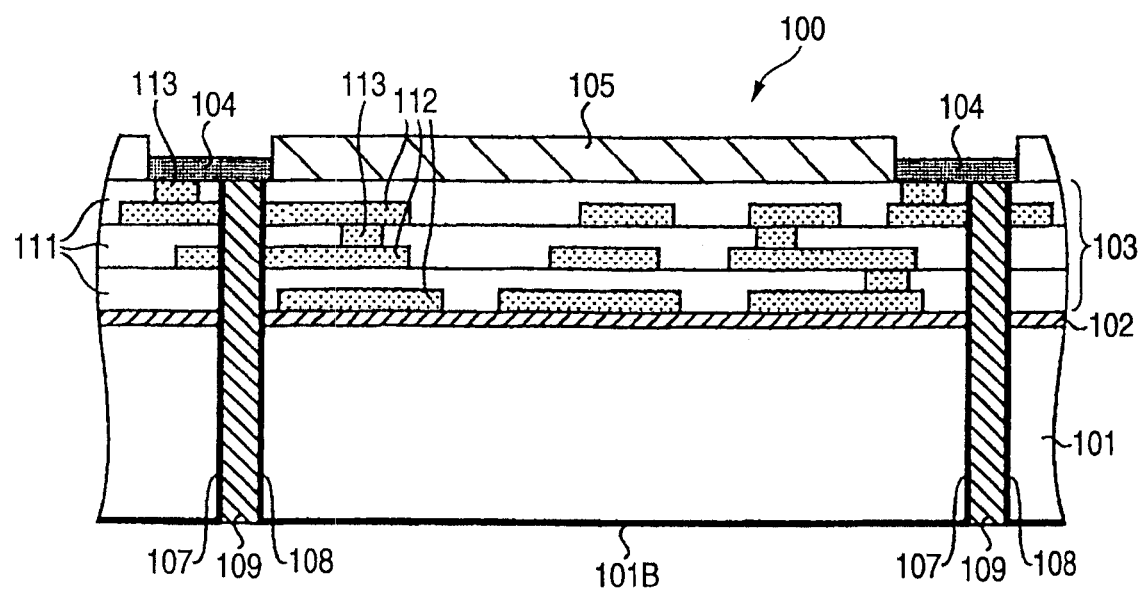
FIG. 22 is a sectional view of a semiconductor chip having through vias in the related art.
Figure 23:
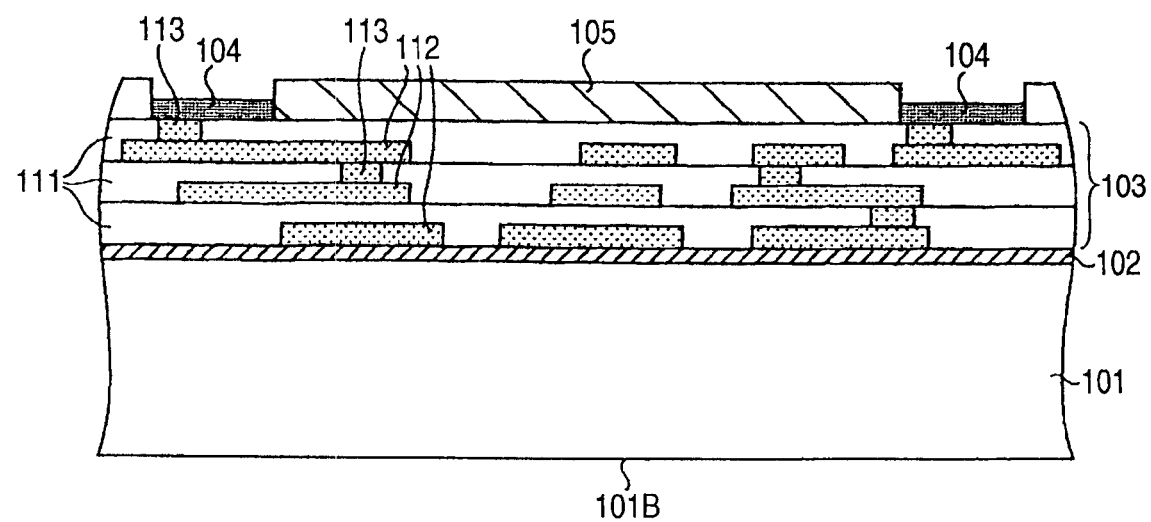
FIG. 23 is a view (#1) showing steps of manufacturing a semiconductor chip in the related art.
Figure 22:
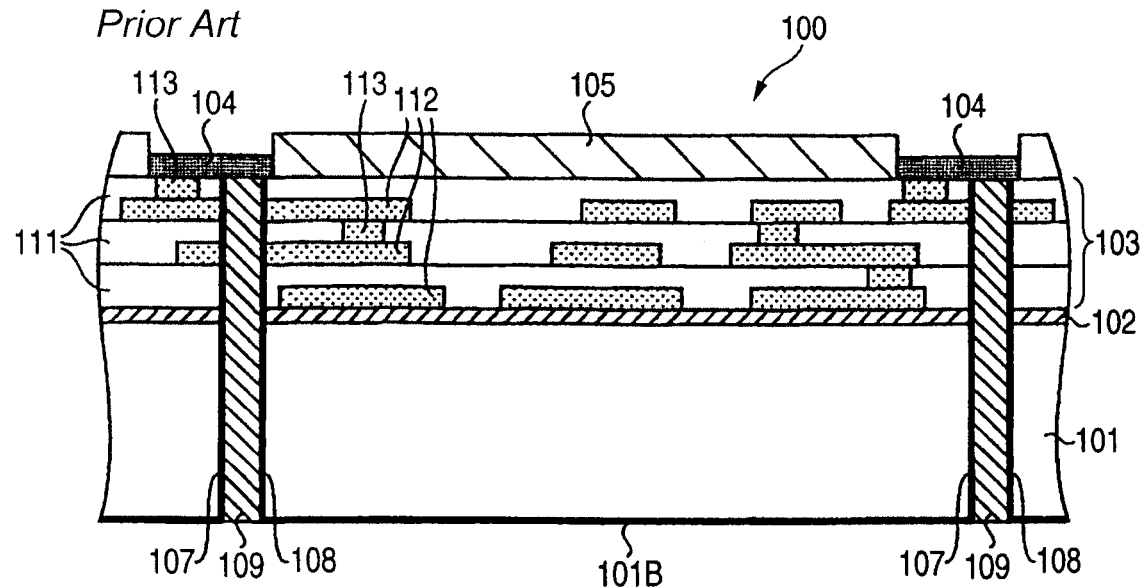
Figure 23:
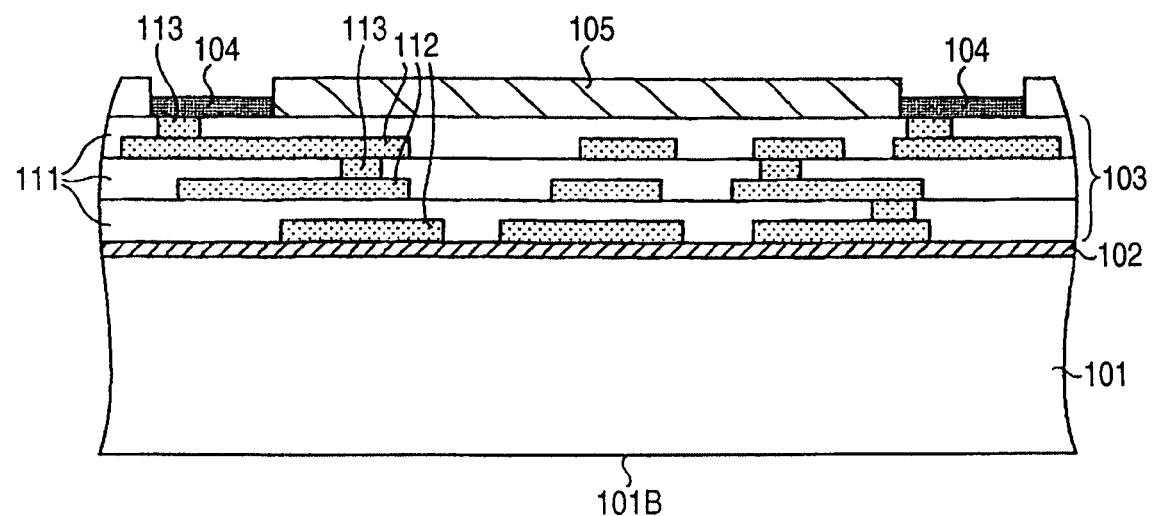
Figure 24:
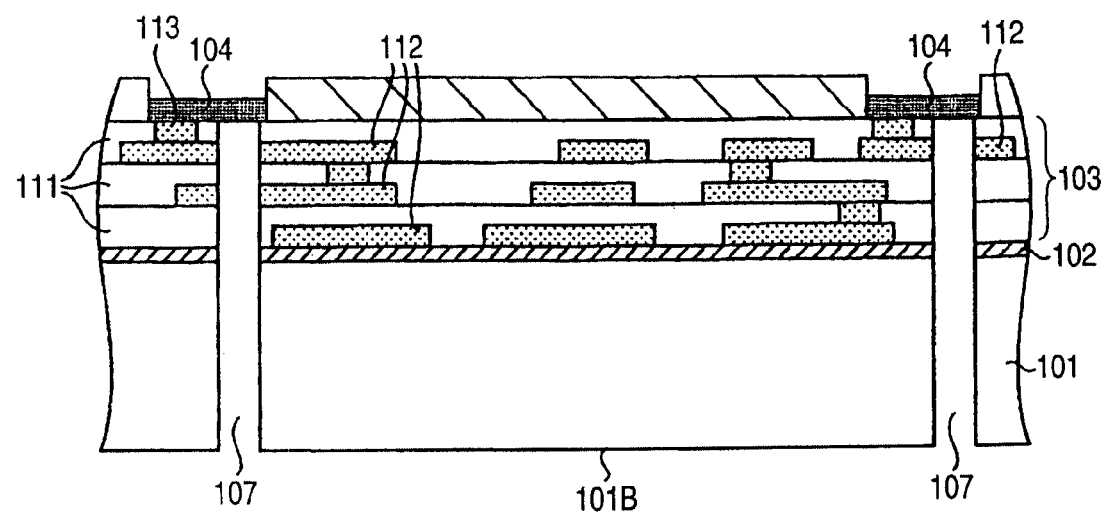
FIG. 24 is a view (#2) showing steps of manufacturing the semiconductor chip in the related art.
Figure 25:
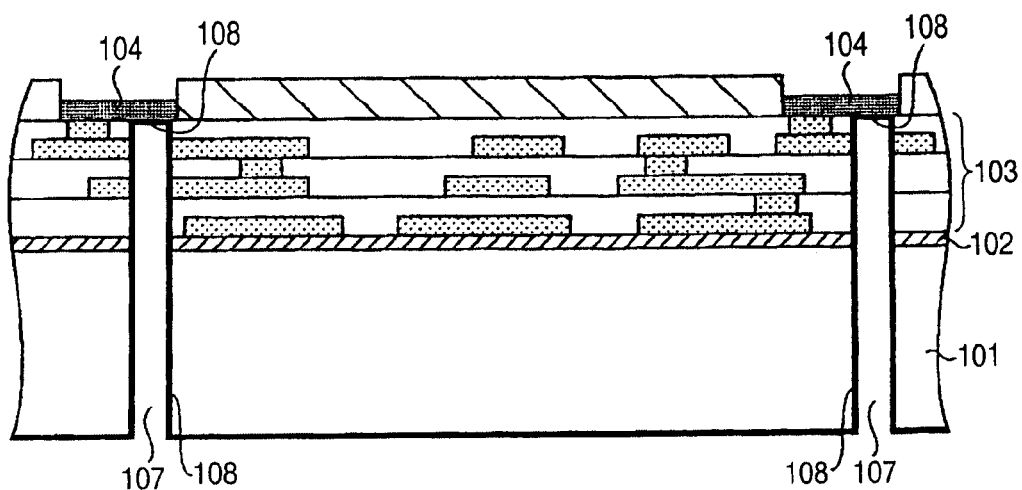
FIG. 25 is a view (#3) showing steps of manufacturing the semiconductor chip in the related art.
Figure 26:
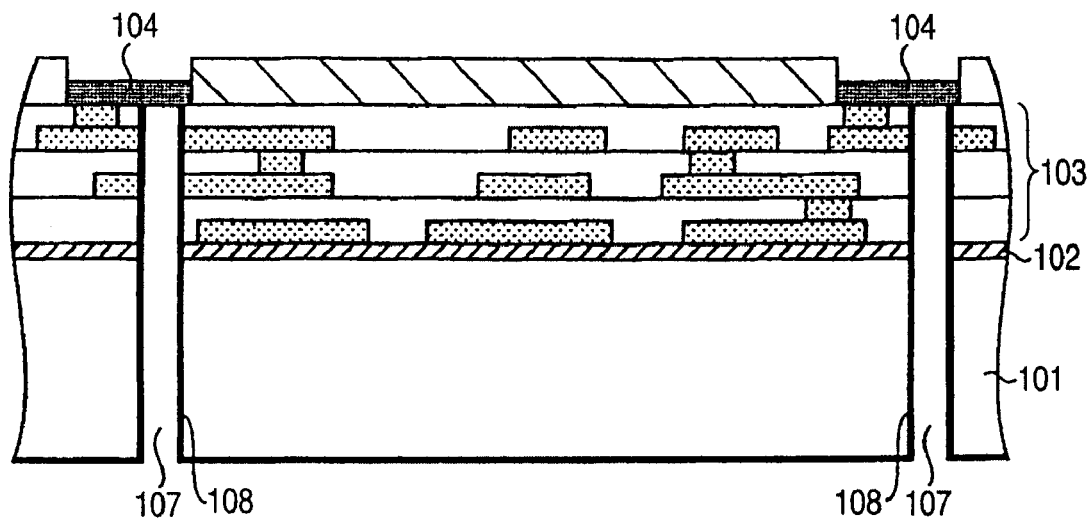
FIG. 26 is a view (#4) showing steps of manufacturing the semiconductor chip in the related art.
Figure 27:
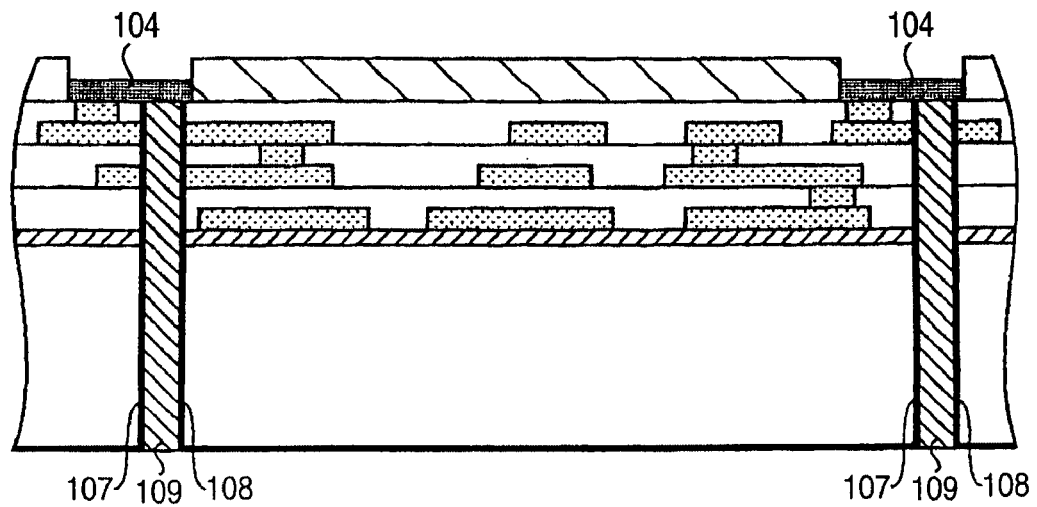
FIG. 27 is a view (#5) showing steps of manufacturing the semiconductor chip in the related art.

FIG. 19 to FIG. 21 are views showing steps of manufacturing a semiconductor chip according to the second variation of the present embodiment. In FIG. 19 to FIG. 21, the same reference symbols are affixed to the same constituent portions as the semiconductor chip 50 explained in FIG. 18.

First, in step in FIG. 19, the insulating film 13, the first and second wiring patterns 22, 53, the insulating layers 21-1 to 21-3, the external connection terminals 15, and the protection film 16 are formed on the semiconductor substrate 11 (containing the first and second wiring pattern forming step). Then, the semiconductor substrate 11 is thinned up to a thickness M1 (semiconductor substrate thinning step). The first and second wiring patterns 22, 53 are formed by the same approach as the steps shown in FIG. 4 to FIG. 9 explained above.

Then, in step in FIG. 20, a resist layer 56 having opening portions 56A in positions, which correspond to forming positions of the through vias 52, is formed on the back surface 11B of the semiconductor substrate 11. Then, the semiconductor substrate 11 is etched by the dry etching method using the resist layer 56 as a mask, and thus opening portions 57 from which the insulating film 13 is exposed are formed.

Then, in step in FIG. 21, the through holes 51 from which the wiring 29 is exposed are formed by removing the insulating film 13 that is exposed from the semiconductor substrate 11. In order to remove the insulating film 13, for example, the dry etching method, the wet etching method, the laser method, or the like can be employed. Then, according to the same approaches as the steps in FIG. 14 to FIG. 16, the insulating film 18 for covering side surfaces of the through holes 51 and the back surface 11B is formed and then the through vias 52 are formed in the through holes 51 on which the insulating film 18 is formed respectively (through via forming step). Thus, the semiconductor chip 50 is manufactured.

With the above, preferable embodiments of the present invention are described in detail. But the present invention is not limited to such particular embodiments, and various variations and modifications can be applied within a range of a gist of the present invention set forth in claims.

The present invention is applicable to a semiconductor chip that is capable of reducing a production cost by forming easily through holes used to provide through vias that are connected electrically to external connection terminals, and a method of manufacturing the same.

What is claimed is:

1. A method of manufacturing a semiconductor chip that includes a semiconductor substrate, a multi-layered wiring structure having a plurality of insulating layers laminated on the semiconductor substrate and a first wiring pattern provided in the plurality of insulating layers, an external connection terminal provided on an uppermost layer of the multi-layered wiring structure, a through via provided in a through hole that passes through the semiconductor substrate, and a second wiring pattern provided in the plurality of insulating layers to connect electrically the through via and the external connection terminal, comprising:
 a first insulating film forming step of forming a first insulating film on a surface of the semiconductor substrate, said first insulating film having an opening portion formed therein during the first insulating film forming step;
 after the first insulating film forming step, a first and second wiring patterns forming step of forming simultaneously the first wiring pattern and the second wiring pattern on the first insulating film, said first wiring pattern being separated from said semiconductor substrate by said first insulating film, said second wiring pattern being formed over said opening portion and including a second wiring pattern via extending through said opening portion to said semiconductor substrate;
 after the first and second wiring patterns forming step, a through hole forming step of forming the through hole in the semiconductor substrate so as to expose said second wiring pattern via, said through hole formed by removing a portion of the semiconductor substrate without removing any of the first insulating film, and said through hole formed with a diameter equal to that of the second wiring pattern via;
 after the through hole forming step, a second insulating film forming step of forming a second insulating film on a side surface of the through hole; and
 after the second insulating film forming step, a through via forming step of forming the through via in the through hole on which the second insulating film is formed, said through via connecting with said second wiring pattern via so as to electrically connect said through via, said second wiring pattern, and said external connection terminal.

2. The method of manufacturing a semiconductor chip, according to claim 1, comprising the further step of:
 thinning the semiconductor substrate prior to the through hole forming step.

3. The method of manufacturing a semiconductor chip, according to claim 1, wherein in the through hole forming step, the through hole is formed in a portion of the semiconductor substrate which is positioned almost directly under the external connection terminal, and
 the second wiring pattern has a plurality of vias and wirings, and in the first and second wiring patterns forming step, the plurality of vias are arranged in the plurality of insulating layers, which are positioned between the through via and the external connection terminal, to intersect almost orthogonally with a surface of the semiconductor substrate.

4. The method of manufacturing a semiconductor chip, according to claim 1,
 wherein during the second insulating film forming step, a portion of the second insulating film is formed on an entirety of an exposed lower surface of the second wiring pattern via, and said portion of the second insulating film is subsequently entirely removed from said exposed lower surface of the second wiring pattern via.

5. The method of manufacturing a semiconductor chip according to claim 1, wherein during the through via forming step, the through via is formed to have a height equal to a height of the semiconductor substrate and to extend with the through hole through the semiconductor substrate and terminate at a side of the first insulating film contacting the semiconductor substrate.

6. The method of manufacturing a semiconductor chip according to claim 1, wherein said first wiring pattern is electrically isolated from the through via and wherein at least a portion of an uppermost insulating layer covers an entire top of the first wiring pattern such that the first wiring pattern is electrically isolated from the external connection terminal provided on the uppermost insulating layer, and wherein the first insulating film covers an entire bottom of the first wiring pattern such that the first insulating film is between the first wiring pattern and the semiconductor substrate.

7. The method of manufacturing a semiconductor chip according to claim 1, wherein the second wiring pattern provided on the first insulating film is an electroplating film.

8. The method of manufacturing a semiconductor chip according to claim 1, wherein during the through hole forming step, the through hole is formed in the semiconductor substrate to expose only a bottom face of the second wiring pattern via in the opening portion without exposing any of the first insulating layer.

9. A method of manufacturing a semiconductor chip that includes a semiconductor substrate, a multi-layered wiring structure having a plurality of insulating layers laminated on the semiconductor substrate and a first wiring pattern provided in the plurality of insulating layers, an external connection terminal provided on an uppermost layer of the multi-layered wiring structure, a through via provided in a through hole that passes through the semiconductor substrate, and a second wiring pattern provided in the plurality of insulating layers to connect electrically the through via and the external connection terminal, comprising:
 a first insulating film forming step of forming a first insulating film on a surface of the semiconductor substrate, said first insulating film having an opening portion formed therein during the first insulating film forming step;

after the first insulating film forming step, a first and second wiring patterns forming step of forming simultaneously the first wiring pattern and the second wiring pattern on the first insulating film, said first wiring pattern being separated from said semiconductor substrate by said first insulating film, said second wiring pattern being formed over said opening portion and including a second wiring pattern via extending through said opening portion to said semiconductor substrate;

after the first and second wiring patterns forming step, a through hole forming step of forming the through hole in the semiconductor substrate so as to expose said second wiring pattern via, said through hole formed by removing a portion of the semiconductor substrate without removing any of the first insulating film, wherein the second wiring pattern via has a uniform diameter, the through via has a uniform diameter, and the diameter of the second wiring pattern via is larger than the diameter of the through via;

after the through hole forming step, a second insulating film forming step of forming a second insulating film on a side surface of the through hole; and after the second insulating film forming step, a through via forming step of forming the through via in the through hole on which the second insulating film is formed, said through via connecting with said second wiring pattern via so as to electrically connect said through via, said second wiring pattern, and said external connection terminal.

10. The method of manufacturing a semiconductor chip according to claim 1, wherein the first wiring pattern electrically connects a plurality of semiconductor elements formed in the semiconductor substrate to constitute a semiconductor circuit.

11. The method of manufacturing a semiconductor chip according to claim 1, wherein the second wiring pattern via and the through via are formed to have uniform and equal diameters.

12. The method of manufacturing a semiconductor chip according to claim 1, wherein during the through hole forming step, the through hole is formed in the semiconductor substrate by etching the semiconductor substrate without etching the first insulating film.

13. The method of manufacturing a semiconductor chip according to claim 1, wherein during the through hole forming step, the through hole is formed only in the semiconductor substrate.

14. The method of manufacturing a semiconductor chip according to claim 1, wherein during the through hole forming step, the through hole is formed by etching only the semiconductor substrate.

15. The method of manufacturing a semiconductor chip according to claim 9, wherein during the through hole forming step, the through hole is formed in the semiconductor substrate with a diameter smaller than that of the second wiring pattern via by etching the semiconductor substrate without etching the first insulating film.

16. The method of manufacturing a semiconductor chip according to claim 8, wherein during the through hole forming step, the through hole formed in the semiconductor substrate exposes only a bottom face of the second wiring pattern via in the opening portion without exposing any other part of the second wiring pattern and second wiring pattern via.

17. The method of manufacturing a semiconductor chip according to claim 1, wherein during the first and second wiring patterns forming step, the second wiring pattern is formed by an electrolytic plating film and the second wiring pattern via is formed by filling the electrolytic plating film in the opening portion of the first insulating film.

* * * * *